United States Patent
Lee et al.

(10) Patent No.: US 7,496,337 B2
(45) Date of Patent: Feb. 24, 2009

(54) METHOD FOR CONTROLLING LNA GAIN STATE

(75) Inventors: Hyun-Mook Lee, Ichon-shi (KR); Young-Nam Seo, Ichon-shi (KR)

(73) Assignee: Pantech&Curitel Communications, Inc., Seoul (KR)

( * ) Notice: Subject to any disclaimer, the term of this patent is extended or adjusted under 35 U.S.C. 154(b) by 512 days.

(21) Appl. No.: 11/025,986

(22) Filed: Jan. 3, 2005

(65) Prior Publication Data
US 2005/0202792 A1 Sep. 15, 2005

(30) Foreign Application Priority Data
Mar. 12, 2004 (KR) .................. 10-2004-0016852

(51) Int. Cl.
*H04B 1/06* (2006.01)

(52) U.S. Cl. ............... 455/234.2; 455/343.1; 455/574; 370/345

(58) Field of Classification Search ........... 455/574, 455/232.1, 233.1, 234.1, 234.2, 343.1; 370/345
See application file for complete search history.

(56) References Cited

U.S. PATENT DOCUMENTS 6,563,891 B1 * 5/2003 Eriksson et al. ............ 375/345
7,162,214 B2 * 1/2007 Eichin et al. .............. 455/127.5

* cited by examiner

*Primary Examiner*—Blane J Jackson
(74) *Attorney, Agent, or Firm*—H.C. Park & Associates, PLC

(57) ABSTRACT

The method for controlling a low noise amplifier (LNA) gain state which is applied to a receiver having the LNA is disclosed. The method includes the steps of: storing an LNA gain state of an idle mode when a state of the receiver transits an idle mode to a sleep mode; and returning to the stored LNA gain state when the receiver transits the sleep mode to the idle mode.

8 Claims, 4 Drawing Sheets

METHOD FOR CONTROLLING LNA GAIN STATE

BACKGROUND OF THE INVENTION

1. Field of the Invention

The present invention relates to a method for controlling a low noise amplifier (LNA) gain state; and, more particularly, to a method for controlling an LNA gain state in order to improve receiver performance of a mobile terminal in a receiver electric-field environment where the LNA gain state is continuously changed.

2. Description of Related Art

Generally, a low noise amplifier (LNA) in a mobile terminal outputs an inter modulation distortion (IMD) component when two continuous waves are inputted. Such an IMD component distorts signals processed in the mobile terminal and it has become a major problem of signal processing in the mobile terminal causing degradation of the mobile terminal.

When two signals of frequency $f_1$ and $f_2$ are inputted in to the LNA, a component of frequency outputted from the LNA can be represented as $mf_1 \pm nf_2$, wherein m and n are positive integers over 1. As the LNA gain increases, an influence of third components (i.e., $2f_1-f_2$ and $2f_2-f_1$) of the IMD component increases to triple times. Therefore, a variable-gain LNA is adapted in order to decrease the LNA gain in a high electric-field as shown in FIG. 1.

Generally, states of the mobile terminal include a sleep mode and an idle mode in order to decrease battery consumption. When the mobile terminal is in the sleep mode, the transmitter and the receiver of the mobile terminal are deactivated and most circuits including a mobile terminal model (MDM) work in a low power consumption mode. Moreover, when the mobile terminal is in the idle mode, the receiver is activated to receive a call from a base station but the transmitter is deactivated.

A state of a code division multiple access (CDMA) mobile terminal switches to the sleep mode or to the idle mode in different ratio according to a slot cycle index (SCI). For example, when the SCI is 0, the mobile terminal switches to the idle mode during 1 slot of total 16 slots (wherein, 1 slot is 80 ms) and remains in the sleep mode during the other 15 slots. In the same manner, when the SCI is 1, the mobile terminal switches to the idle mode during 1 slot of total 32 slots and remains in the sleep mode during the other 31 slots. When a SCI is 2, the mobile terminal switches to the idle mode during 1 slot of total 64 slots and remains in the sleep mode during the other 63 slots. Herein, the smallest value between the values of the SCI in the mobile terminal and the base station is determined as the value of the SCI. The base station determines time to wake up the terminal from the idle mode according to the determined value of the SCI. As mentioned above, the CDMA terminal switches to the idle mode by controlling the ratio of the sleep mode and the idle mode based on the SCI, to thereby decrease a system load and extend the period of the battery usage.

FIG. 1 is a graph showing a LNA gain state in a calling mode in accordance with prior art.

As shown in FIG. 1, the LNA gain state generally includes 4 steps. A first gain state (0) that is the highest state among the 4 steps and a fourth gain state (3) that is the lowest gain state.

FIG. 2 is a flowchart describing steps for entering a sleep mode in a conventional LNA gain state controlling method.

The LNA gain state of the LNA in the receiver of the mobile terminal is set as the fourth gain state (3) that is the lowest gain state at step S201. Setting up the LAN gain state at step S201 can be performed by following function.

rf_set_lna_decision_to_low gain_state( );

Then, the mode of the receiver is switched to the sleep mode, i.e., the power down mode at step S202. Setting up the mode at step S202 can be performed by the following function.

rfr_sleep_enable( );

FIG. 3 is a flowchart describing steps for entering an idle mode and activating the LNA and the AGC function in a conventional LNA gain state controlling method.

The LNA gain state of the LNA is set as the fourth gain state (3) that is the lowest gain state at step S301. Setting up the LAN gain state at step S301 can be performed by following function.

rf_set_lna_decision_to_low_gain_state( );

Then, an automatic gain control (AGC) function is deactivated at step S302. The AGC function is a function for determining an AGC value according to received electric-field intensity and controlling the LNA gain according to the determined AGC value. Setting up the AGC function at step S302 can be performed by the following function.

HWIO_OUTM(AGC_RDWR_CTL, CAGC_AGC_OVRD_M, CAGC_AGC_FRZ_V);

Then, the AGC value is set as a value of the lowest gain state, i.e., the fourth gain state (3) at step S303. Setting up the AGC value at step S303 can be performed by following function.

rf_set_agc_value_to_low_gain( );

Then, the mode of the receiver is switched to the idle mode at step S304. Setting up the mode at step S304 can be performed by following function.

rfr_cdma_wakeup( );

Then, the LNA is activated at step S305. Setting up the LAN gain state at step S305 can be performed by following function.

RF_LNA_STATE_MACHINE_NORMAL( );

Then, the AGC function is activated at step S306. Setting up the AGC function at step S306 can be performed by following function.

HWIO_OUTM(AGC_RDWR_CTL, CAGC_AGC_OVRD_M, CAGC_AGC_NRM_V);

Operations of the above mentioned conventional LNA gain state controlling method are described hereinafter.

A table 1 presents a result of measuring an $E_c/I_o$ (in dB) of a pilot channel of the mobile terminal according to intensity of received electric field. The $E_c/I_o$ is average energy, wherein $E_c$ is energy integrated during one pseudo noise (PN) chip period and $I_o$ is a total receipt power spectrum intensity including a noise measured at an antenna connection. As the $E_c/I_o$ increases, a reception rate in a field becomes increased.

TABLE 1

|  | −85 dBm | −87 dBm | −89 dBm | −91 dBm | −93 dBm | −95 dBm |
| --- | --- | --- | --- | --- | --- | --- |
| First gain state | −6.0~−7.5 | −6.0~−7.5 | −6.0~−7.5 | −6.0~−7.5 | −7.0~−8.0 | −7.0~−8.0 |
| Second gain state | −7.0~−8.0 | −7.0~−8.0 | −7.5~−8.5 | −8.0~−9.0 | −8.5~−10.0 | −9.5~−11.0 |

By Referring to an embodiment of the prior art with LNA gain state in an idle mode, it can be estimated that a gain is switched at a specific electric field value (which will be referred to as a switching point hereinafter) because the terminal operates as the gain state is switched from the high electric-field in the conventional idle mode.

It is assumed that a switching point at which the LNA switches from the first gain state to the second gain state is −91 dBm. When the electric-field value is −93 dBm, the receiver wakes up in the idle mode from the sleep mode.

Under the above assumption, if the electric-field value becomes strong as −89 dBm after the receiver wakes up in the idle mode, the LNA switches to the second gain state.

Then, the LNA gain is switched according to FIG. 1. Because a hysterisis range, where the first gain state (0) is changed to the second gain state (1), is from −91 dBm to −86.2 dBm, the second gain state (1) is maintained while the electric-field value is weaker than −91 dBm.

If the receiver does not switch to the sleep mode, the first gain state (0) is maintained although the electric-field value becomes −89 dBm according to FIG. 1.

As referring to the table 1, the $E_c/I_o$ becomes increased by 1.5 bB since the mode is switched to the sleep mode under the above assumption and thereby the reception rate becomes decreased.

As mentioned above, the LNA gain state of the LNA in the receiver of the mobile terminal is forcibly switched to the fourth gain state (3) when the mode is switched from the idle mode to the sleep mode. Therefore, when the mode is switched back from the sleep mode to the idle mode, the LNA gain is controlled like the LNA gain is controlled in the high electric-field. Accordingly, if there is the electric-field value in the hysterisis range as shown in FIG. 1, the LNA gain is switched to a state one step lower than the state in the idle mode before the conversion. Therefore, the reception rate becomes degraded.

SUMMARY OF THE INVENTION

It is, therefore, an object of the present invention to provide a method for controlling LNA gain state by always maintaining an LNA gain state as an advantageous gain state in order to improve receiver performance for a mobile terminal having a receiver.

In accordance with an aspect of the present invention, there is provided a method for controlling a low noise amplifier (LNA) gain state which is applied in a receiver including the LNA, the method including the steps of: a) storing an LNA gain state of an idle mode when the receiver switches to a sleep mode from an idle mode; and b) returning to the LNA gain state stored at step a) when the receiver switches to an idle mode from a sleep mode.

In accordance with another aspect of the present invention, there is provided a method for controlling a low noise amplifier (LNA) which is applied to a receiver including lower gain state and higher gain state according to a hysterisis range by using multiple LNA gain states according to an electric-field value, the method including the steps of: a) storing a first reference electric-field value which is a lower gain state of an LNA gain state of an idle mode when the receiver switches to the sleep mode from the idle mode; and b) adjusting the LNA gain state by referring to current field value after returning to the LNA gain state according to the second reference field value when the receiver switches to the idle mode from the sleep mode.

In accordance with another aspect of the present invention, there is provided a method including the steps of: acquiring a current LNA gain state and storing the first reference electric-filed value which is a lower gain state in order to determine the current LNA gain state; setting the LNA gain state of the LNA to a lowest implemented gain state; and switching a mode of the receiver into the sleep mode.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Hereinafter, a method for controlling an LNA gain state will be described in detail with reference to the accompanying drawings.

Figure 1:
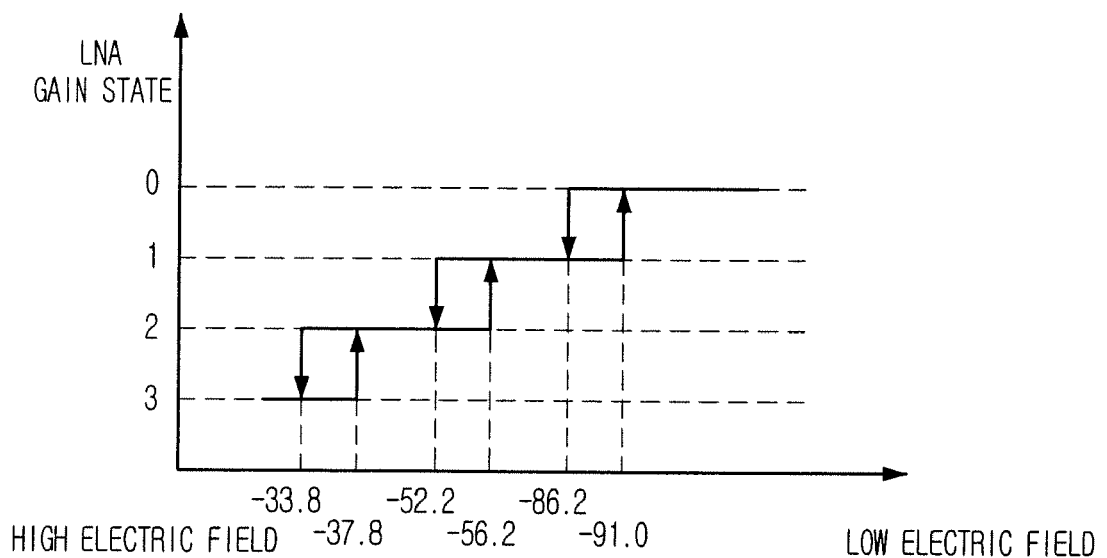
FIG. 1 is a graph showing a low noise amplifier (LNA) gain state in a calling mode in accordance with a prior art.
Figure 2:
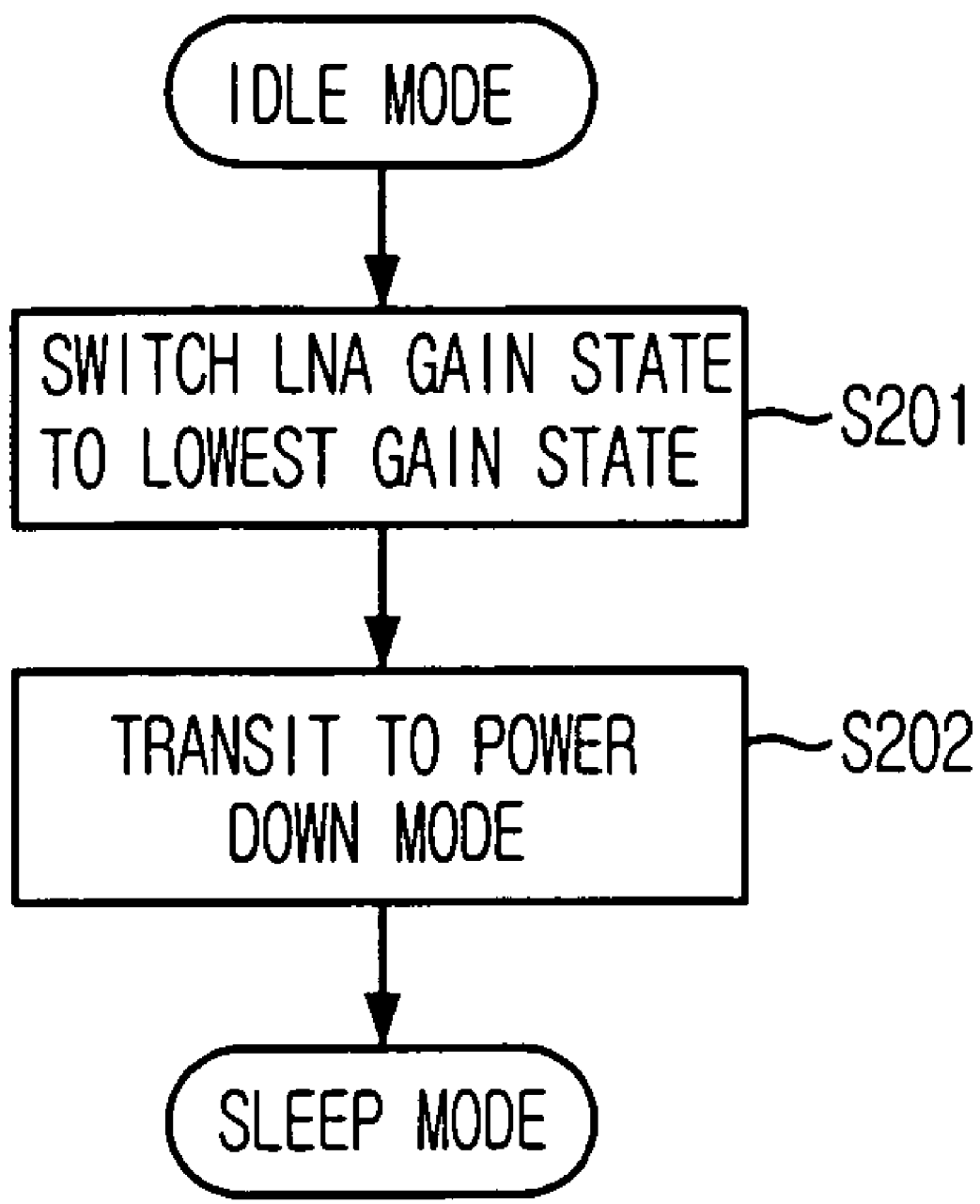
FIG. 2 is a flowchart describing steps for entering a sleep mode in a conventional LNA gain state controlling method.
Figure 3:
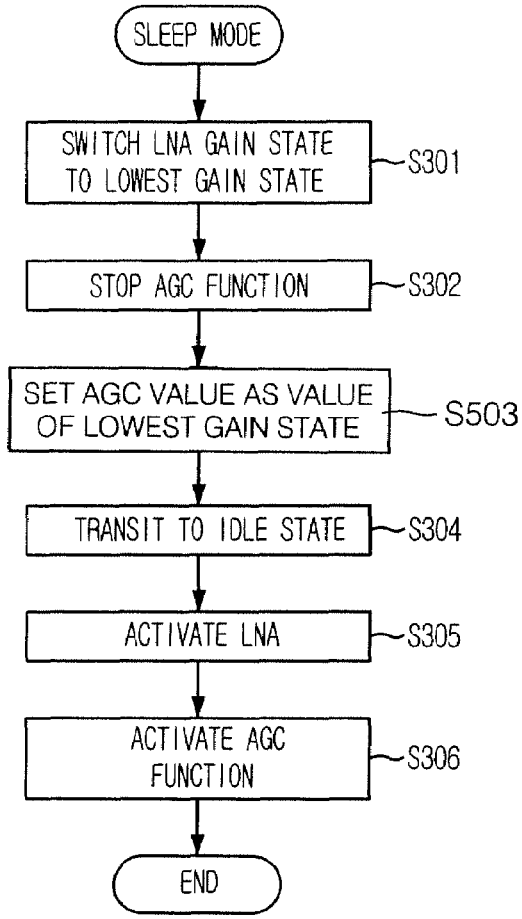
FIG. 3 is a flowchart describing steps for entering an idle mode and activating LAN and the AGC function in a conventional LNA gain state controlling method.
Figure 4:
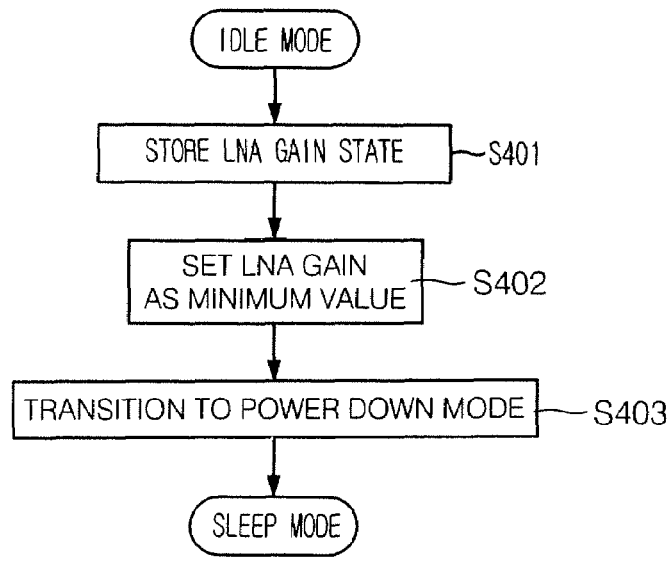
FIG. 4 is a flowchart describing a method for controlling an LAN gain state in order to enter the receiver into a sleep mode in accordance with a preferred embodiment of the present invention.

FIG. 4 is a flowchart describing a method for controlling an LNA gain state in order to enter the receiver into a sleep mode in accordance with a preferred embodiment of the present invention.

At first, current LNA gain state is obtained and a reference electric-field value is stored at step S401, where the reference electric-field value is an electric field value of a lower gain state for attaining the current LNA gain state. The step S401 can be described in a program code as follows. The reference electric-field value is not limited to the lower gain state and it can be a value that reflects the current gain state (e.g., a value under the lower).

Ina_gain_state_before_sleep=rf_get_Ina_gain_state( );

Then, the LNA gain state of the LNA in the receiver of the mobile terminal is set as the fourth gain state (3) that is a lowest gain state at step S402. The step S402 is described in a program code as follows.

rf_set_Ina_decision_to_low_gain_state( );

Then, the mode of the receiver is switched to the sleep mode, i.e., the power down mode at step S403. The step S403 is described in a program code as follows.

rfr_sleep_enable( );

Therefore, when the receiver switches the idle mode into the sleep mode, the LNA gain state before switching is stored by storing the reference electric-field value which is the lower gain state of the LNA gain state in the idle mode.

Figure 5:
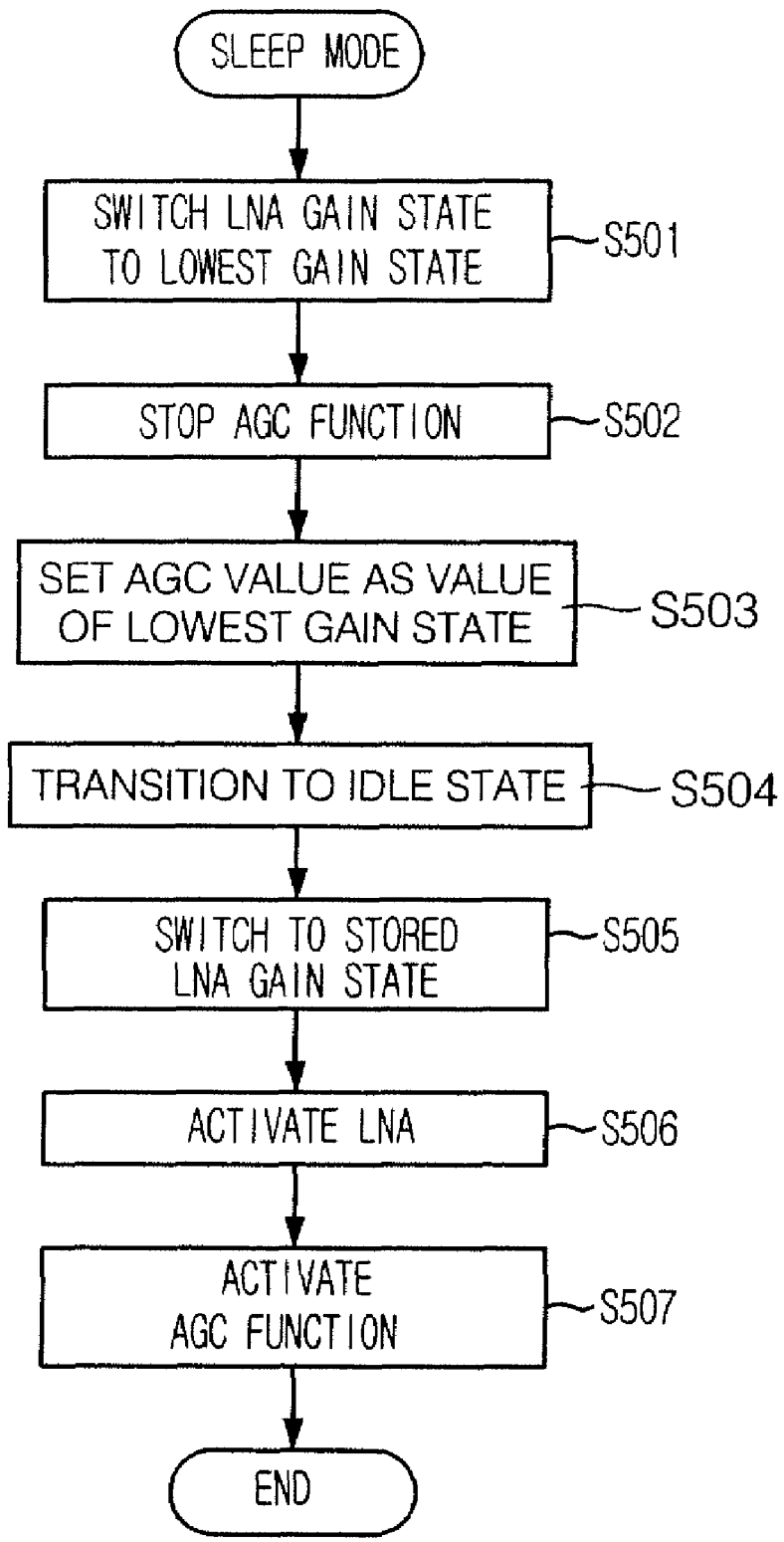
FIG. 5 is a flowchart describing a method for controlling an LNA gain state in order to enter the receiver into an idle mode in accordance with a preferred embodiment of the present invention.

FIG. 5 is a flowchart describing a method for controlling an LNA gain state in order to enter the receiver into an idle mode in accordance with a preferred embodiment of the present invention.

At first, the LNA gain state of the LNA is determined as the fourth gain state (3) that is the lowest gain state at step S501. The step S501 can be described in a program code as follows.

rf_set_lna_decision_to_low_gain_state( );

After determining the LNA gain state of the LNA, automatic gain control (AGC) function is deactivated at step S502. The AGC function is a function for determining an AGC value according to the received electric-field intensity and controlling the LNA gain according to the determined AGC value.

The step S502 can be described in a program code as follows.

HWIO_OUTM(AGC_RDWR_CTL, CAGC_AGC_OV-RD_M, CAGC_AGC_FRZ_V);

Then, the AGC value is set as a value of the lowest gain state at step S503. The step S503 is described in a program code as follows.

rf_set_agc_value_to_low_gain( );

Then, the mode of the receiver is switched to the idle mode at step S504. The step S504 is described in a program code as follows.

rfr_cdma_wakeup( );

The AGC value is determined according to the reference electric-field value at step S505. Thus, when the method in FIG. 4 is processed, the gain state is switched to the LNA gain state stored before the mode is switched from the idle mode to the sleep mode and the step S505 can be described in a program code as follows.

rf_set_agc_val_to_gain_before_sleep(Ina_gain_state_before_sleep);

Then, the LNA is activated at step S506. The step S506 can be described in a program code as follows.

RF_LNA_STATE_MACHINE_NORMAL( );

The AGC function is activated at step S507. The step S507 can be described in a program code as follows.

HWIO_OUTM(AGC_RDWR_CTL, CAGC_AGC_OV-RD_M, CAGC_AGC_NRM_V);

Therefore, the current electric-field value is attained by using the AGC function and the LNA gain state is determined according to the current electric-field value.

By referring to the table 1, operations of the present invention are described hereinafter.

It is assumed that the hysterisis range is set as −91 dBm to −86.2 dBm. When the electric-field value is −93 dBm in the idle mode, the mode of the receiver is switched to the sleep mode and switched back from the sleep mode to the idle mode. Under the above assumption, the lower gain state value −91 dBm is stored before the receiver switches to the sleep mode, wherein the lower gain state value is the lower gain state value causing the gain state to be switched to the first gain state (0) of −93 dBm.

In case of a conventional method as mentioned above, if the electric-field value becomes −89 dBm after the mode is switched to the idle mode, the LNA is operated in the way the LNA is operated in a high electric field after the mode of the LNA is switched to the sleep mode since the LNA forcibly switches to in the fourth gain state (3) and then the LNA is maintained in the second gain state (1). However, in the present invention, the lower gain state value switching the LAN into the first gain state (0) is set as −91 dBm and it changes to −89 dBm of the current electric-field value after the LNA is switched to the first gain state (0). Therefore, −89 dBM of the current electric-field value is a weaker electric field compared to the upper value −86.2 dBm and accordingly, the LNA is maintained in the first gain state (0). That is, the present invention prevents decrease of the $E_c/I_o$ by 1.5 dB due to mode transition to the sleep mode.

As mentioned above, the method of the present invention can be embodied as a set of computer executable instructors and stored in computer readable recording media such as a CD-a ROM, a RAM, a floppy disk, a hard disk and a magneto-optical disk.

As mentioned above, the present invention can increase the reception efficiency by maintaining the LNA gain state as the advantageous gain state reflecting the hysterisis range of the calling mode.

The present application contains subject matter related to Korean patent application No. 2004-16852, filed in the Korean intellectual Property Office on Mar. 12, 2004, the entire contents of which being incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A method for controlling a low noise amplifier (LNA) gain state which is applied to a receiver having an LNA including multiple LNA gain states according to an electric-field value and a lower gain state and a higher gain state according to a hysterisis range when switching to the LNA gain states, the method comprising:
   storing a first reference electric-field value which is a lower gain state of an LNA gain state in an idle mode and then switching a mode of the receiver from the idle mode to a sleep mode; and
   switching the mode of the receiver from the sleep mode to an idle mode and then controlling the LNA gain state by referring to a current electric-field value after returning to the LNA gain state according to the first reference electric-field value.

2. The method as recited in claim 1, wherein the storing further comprises:
   obtaining the current LNA gain state and storing the first reference electric-field value which is a lower gain state in order to attain the current LNA gain state;
   setting the LNA gain state of the LNA as a lowest gain state; and
   switching a mode of the receiver to the sleep mode.

3. The method as recited in claim 1, wherein the controlling further comprises:
   switching the mode of the receiver to the idle mode; and
   determining the LNA gain state based on the first reference electric-field value.

4. The method as recited in claim 1, wherein the receiver includes an automatic gain control (AGC) function that controls the LNA gain of the receiver based on an AGC value corresponding to the electric-field value, and wherein the controlling further comprises:
   setting the LNA gain state of the LNA as the lowest gain state;
   deactivating the AGC function;
   setting the AGC value to a value at which the LNA gain becomes a minimum value;
   switching the mode of the receiver to the idle mode;
   setting the AGC value based on the first reference electric-field value;
   activating the LNA; and
   activating the AGC function.

5. A method for controlling a low noise amplifier (LNA) gain state which is applied to a receiver having an LNA including multiple LNA gain states according to an electric-field value and a lower gain state and a higher gain state according to a hysterisis range when switching to the LNA gain states, the method comprising:
  storing a second reference electric-field value which is a lower gain state of an LNA gain state of an idle mode and then switching a mode of the receiver from the idle mode to a sleep mode; and
  switching the mode of the receiver from the sleep mode to an idle mode and then controlling the LNA gain state by referring to a current electric-field value after returning to the LNA gain state based on the second reference electric-field value.

6. The method as recited in claim 5, wherein the storing further comprises:
  obtaining the current LNA gain state and storing the second reference electric-field value which is a lower gain state in order to attain the current LNA gain state;
  setting the LNA gain state of the LNA as a lowest gain state; and
  switching a mode of the receiver to the sleep mode.

7. The method as recited in claim 5, wherein the controlling further comprises:
  switching the mode of the receiver to the idle mode; and
  determining the LNA gain state based on the second reference electric-field value.

8. The method as recited in claim 5, wherein the receiver includes an automatic gain control (AGC) function that controls the LNA gain of the receiver based on an AGC value corresponding to the electric-field value, and wherein the controlling further comprises:
  setting the LNA gain state of the LNA as the lowest gain state;
  deactivating the AGC function;
  setting the AGC value as a value at which the LNA gain becomes a minimum value;
  switching the mode of the receiver to the idle mode;
  setting the AGC value based on the second reference electric-field value;
  activating the LNA; and
  activating the AGC function.

* * * * *